(12) United States Patent
Lu et al.

(10) Patent No.: US 7,663,229 B2
(45) Date of Patent: Feb. 16, 2010

(54) LIGHTING DEVICE

(75) Inventors: Ming Lu, Sijhih (TW); Kai Chiu Wu, New Territories (CN); Chak Hau Pang, New Territories (CN)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 334 days.

(21) Appl. No.: 11/727,929

(22) Filed: Mar. 29, 2007

(65) Prior Publication Data

US 2008/0049399 A1 Feb. 28, 2008

Related U.S. Application Data

(63) Continuation-in-part of application No. 11/492,837, filed on Jul. 26, 2006, now Pat. No. 7,482,632.

(60) Provisional application No. 60/830,110, filed on Jul. 12, 2006.

(30) Foreign Application Priority Data

Nov. 24, 2006 (HK) ............................ 06112953.4

(51) Int. Cl.
*H01L 23/34* (2006.01)
(52) U.S. Cl. ............................... 257/712; 257/E23.08
(58) Field of Classification Search ................ 340/815; 257/88, 89
See application file for complete search history.

(56) References Cited

U.S. PATENT DOCUMENTS

| | | | |
|---|---|---|---|
| 5,577,832 A | 11/1996 | Lodhie | |
| 6,525,668 B1 * | 2/2003 | Petrick | 340/815.45 |
| 6,609,816 B2 | 8/2003 | Ansari et al. | |
| 6,827,469 B2 | 12/2004 | Coushaine et al. | |
| 6,880,956 B2 | 4/2005 | Zhang | |
| 6,991,355 B1 | 1/2006 | Coushaine et al. | |
| 7,040,790 B2 | 5/2006 | Lodhie et al. | |
| 2004/0066142 A1 | 4/2004 | Stimac et al. | |
| 2005/0243559 A1 | 11/2005 | Coushaine et al. | |

FOREIGN PATENT DOCUMENTS

| | | |
|---|---|---|
| CN | 2485801 | 4/2002 |
| CN | 2644878 | 9/2004 |
| CN | 1689376 | 10/2005 |
| CN | 1693750 | 11/2005 |

OTHER PUBLICATIONS

International Search Report Application No. PCT/CN2007/071415 dated Apr. 10, 2008.

* cited by examiner

*Primary Examiner*—Zandra Smith
*Assistant Examiner*—Paul E Patton
(74) *Attorney, Agent, or Firm*—Buchanan Ingersoll & Rooney PC

(57) ABSTRACT

A lighting device contains a plurality of light emitting sources mounted on a thermally conductive housing and electrically connected to a circuit board. The housing includes a base portion which is spaced apart from the circuit board, and an intermediate heat dissipation structure which is disposed between the circuit board and the base portion of the housing, for promoting cooling by convection. The plurality of light emitting sources are in thermal communication with the intermediate heat dissipation structure.

32 Claims, 10 Drawing Sheets

LIGHTING DEVICE

FIELD OF THE INVENTION

This invention relates to lighting devices, and more particularly, to lighting devices comprising a plurality of discrete light emission components mounted on a common housing. More specifically, other not solely limited thereto, this invention relates to a lighting device comprising a plurality of light-emitting diodes (LEDs) on a housing.

BACKGROUND OF THE INVENTION

Lighting devices with a high luminosity density are known to be useful. A plurality of light emitting sources is usually assembled in a housing in order to increase luminosity density. However, as the density of light-emitting sources increases, the problem of waste heat and the need of efficient heat dissipation becomes an important issue.

LEDs (Light-emitting diodes) have become a popular choice of light-emitting sources due to its high electro-optical conversion efficiency as well as their long operating life span. However, it is well-known that the electro-optical conversion efficiency of an LED drops rapidly when temperature increases. Therefore, the problem of efficient heat dissipation management is especially noticeable for lighting devices comprising LEDs as lighting sources.

US 2004/0264195 describes an LED light source with a plurality of LEDs bonded to a heat sink with a printed circuit board surrounding the LED source and overlying the heat sink to mitigate degradation in light-emitting efficiency due to rising temperature. However, such an arrangement does not provide a satisfactory and/or sufficiently efficient heat dissipation scheme for efficient operation of a lighting device comprising a plurality of LEDs, especially a lighting device comprising plurality of LEDs in a relatively confined environment. Therefore, it would be desirable if there can be provided improved lighting devices with enhanced heat dissipation schemes or arrangements.

SUMMARY OF THE INVENTION

According to the present invention, there is provided a lighting device comprising a plurality of light emitting sources mounted on a thermally conductive housing and electrically connected to a circuit board, wherein said housing comprises a base portion which may be spaced apart from said circuit board, and an intermediate heat dissipation structure which is disposed intermediate said circuit board and said base portion of said housing, for promoting cooling by convection; and wherein said plurality of light emitting sources may be in thermal communication with said intermediate heat dissipation structure.

Since the forward surface of a lighting device is usually covered by an insulator, for example, by a clear lens, heat dissipation arrangement comprising a convection cooling surface arranged rearward of the light sources is beneficial for efficient dissipation of heat away from the light emitting sources.

To enhance heat dissipation efficiency, the intermediate heat dissipation structure comprises a plurality of heat dissipating fins extending between the base portion of the housing and the circuit board.

In an exemplary embodiment, there is provided a lighting device comprising a thermally conductive housing comprising a base portion, a plurality of spaced-apart protrusions extending from the base portion, and a peripheral housing surrounding said protrusions; and a plurality of light emitting sources electrically connected to a circuit board, wherein each said light emitting source may be mounted on a said protrusion and in thermal communication therewith so that heat generated by said plurality of light emitting sources is transferable from said light emitting sources via said protrusions to said thermally conductive housing for heat dissipation; wherein said printed circuit board and said housing may be arranged for convection cooling of said protrusions by air flow between said printed circuit board and said housing.

In another exemplary embodiment, there is provided a lighting device comprising a plurality of light emitting sources mounted on a thermally conductive housing and electrically connected to a circuit board, wherein said housing comprises a base portion which may be spaced apart from said circuit board and an intermediate heat dissipation structure disposed intermediate said circuit board and said base portion of said housing, said intermediate heat dissipation structure being arranged for promoting cooling by convection; each said light emitting source is mounted on a said protrusion and in thermal communication therewith so that heat generated by said plurality of light emitting sources is transferable from said light emitting sources via said protrusions to said thermally conductive housing for heat dissipation; and wherein said circuit board may be spaced apart from said base portion of said housing such that a space for dissipation of heat by convection is formed between said circuit board and said base portion of said housing.

By creating a heat dissipating structure which is located rearwards of the light sources, and by configuring the heat dissipating structure to promote cooling by convection, the temperature of the lighting emitting sources could be maintained at an acceptable level with respect to the ambient condition.

The intermediate heat dissipation structure may comprise a plurality of protrusions thermally connecting said plurality of light emitting sources with said housing, said plurality of protrusions being spaced apart with respect to each other, and wherein the spacing between adjacent protrusions is arranged so as to allow heat dissipation from said protrusions upon movement of air across said housing.

Each said light emitting source may be mounted on a said protrusion so that heat generated by a light emitting source is transferable to said base portion via said protrusion for heat dissipation.

Each said light emitting source may be mounted on a forward end or a free end of a said protrusion to allow forward emission of light away from said base portion and along a primary optical axis, and wherein each said protrusion may extend forwardly along the primary optical axis of the light emitting source mounted thereon.

Each said protrusion may extend axially from said main housing towards said circuit board.

The circuit board may be mounted on said housing at a location proximal to the forward end of said plurality of protrusions.

The circuit board may comprise a printed circuit board which is formed on a thermally insulated substrate.

The thermally conductive housing may comprise a base portion and a peripheral portion, said peripheral portion extending from said base portion and surrounding said plurality of protrusions.

The printed circuit board may be mounted to a forward end of said peripheral portion of said housing, and wherein said printed circuit board is orthogonal to said protrusions.

Driver circuitry for operation and/or control of said plurality of light emitting sources may be formed on said printed circuit board.

A plurality of venting apertures may be formed on said printed circuit board.

The protrusions and said peripheral portion of said housing may collectively form a support structure for receiving said printed circuit board on said housing in a close fitted manner.

The peripheral portion of said housing may be grid-like such that a plurality of heat dissipation paths for heat dissipation by convection involving said protrusions is defined between lateral extremities of said peripheral portion of said housing.

Each light emitting source may be covered by a lens.

When a light source comprises a LED chip, a light emitting source comprising a light emitting chip, including a light emitting diode chip or a laser diode chip, may be individually mounted on a forward or free end of said protrusion with said chip in thermal communication with said protrusion.

For example, each said protrusion may be elongate, finger-shaped or column-shaped, and has a longitudinal axis parallel to the forward optical axis of the light emitting source mounted thereon.

Each said protrusion may be between 3 mm and 20 mm in height.

Each protrusion may have an effective diameter of between 4 to 7 mm.

The printed circuit board may be substantially orthogonal to the longitudinal axis of said protrusions.

The printed circuit board may be supported on said protrusions with free ends of said plurality of protrusions extending through said printed circuit board.

The axial spacing between said printed circuit board and said base portion of said housing may be at least 3 mm.

At least one thermally conductive member for dissipating heat from said plurality of protrusions may be disposed intermediate said printed circuit board and the base of said protrusions, said thermally conductive member being thermally coupled to said protrusions and said housing so that a portion of heat generated by said plurality of light emitting sources is transferred to said housing via said protrusions and said thermally conductive member.

The thermally conductive member may comprise a metallic board which is parallel to and spaced apart from said printed circuit board; said metallic board being thermally bonded to said protrusions and said housing, and being arranged for dissipating heat generated by said light emitting sources.

The metallic board and said printed circuit board may be spaced apart to permit convection cooling there-between.

A plurality of venting apertures may be formed on said thermally conductive heat dissipation member.

To further increase the heat dissipation area, the peripheral housing may be connected to a said protrusion by a radial extending heat dissipating fin. As seen in FIG. 3, the plane of a radial heat dissipation fin is coplanar with the longitudinal axis of a corresponding protrusion from which the fin extends.

BRIEF DESCRIPTION OF THE DRAWINGS

Preferred embodiments of the present invention will be explained in further detail below by way of examples and with reference to the accompanying drawings, in which:—

DETAILED DESCRIPTION OF THE PREFERRED EMBODIMENTS

Figure 1:
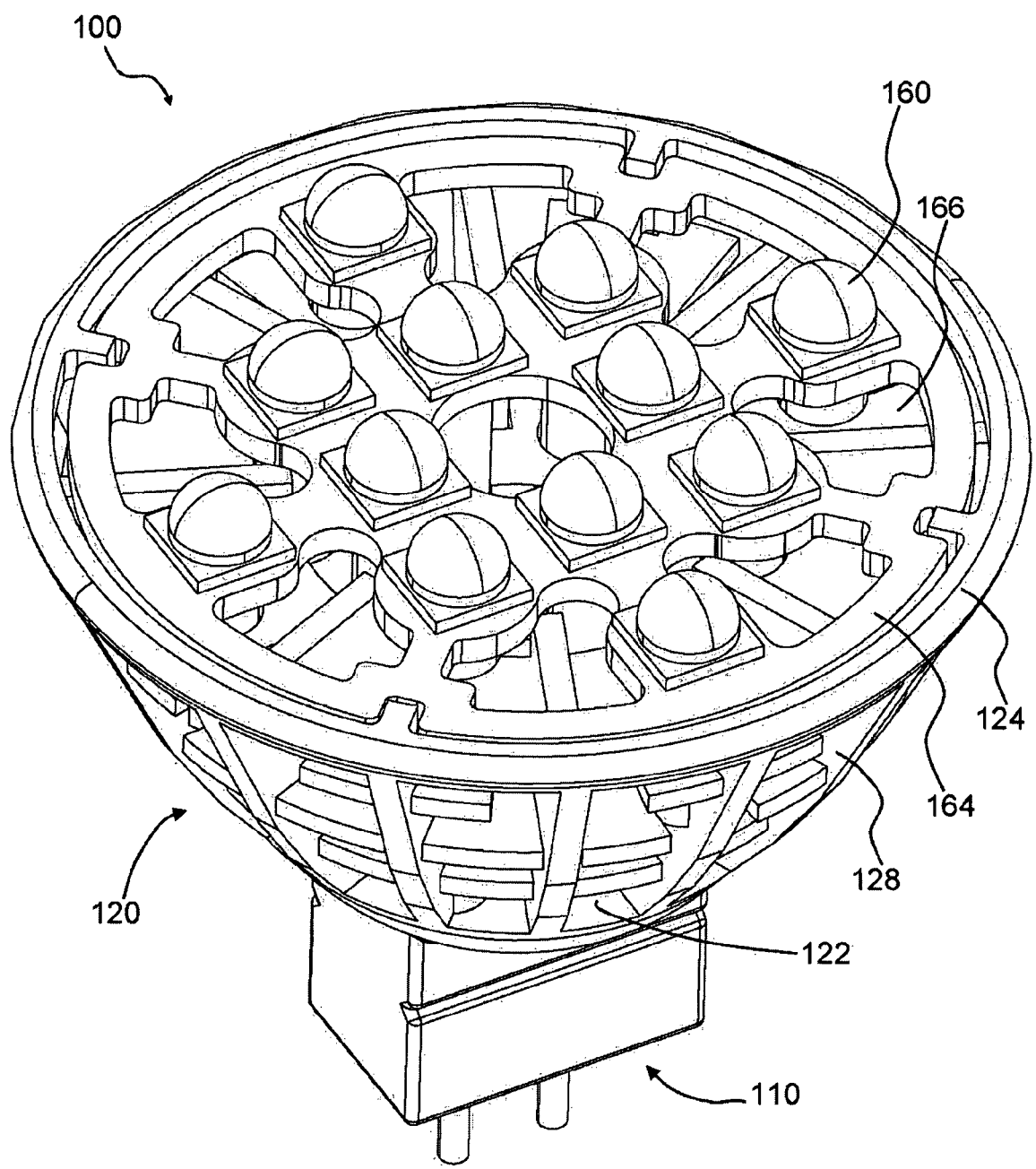
FIG. 1 is a perspective view of a lighting device illustrating a first embodiment of the present invention.

An exemplary embodiment of this invention of a light device 100 as depicted in FIGS. 1 to 9 comprises a plurality of light-emitting diodes (LEDs) on a lamp fixture. The lamp fixture is compatible to the commonly known MR-16 lamp fixture, as a convenient example. The lamp fixture comprises a lamp body, which has a main housing on which a plurality of LEDs is mounted, and a lamp base, which has an electrical connector for connecting to the power supply (not shown). In the example device of FIG. 1, the electrical connector is a bayonet-type plug 110 with two, positive and negative, electrodes.

The lamp body comprises a thermally conductive main housing 120 on which a plurality of column-shaped or finger-shaped elongate protrusions 140 is formed. As shown in the Figures, the main housing is cup-shaped, and comprises a base portion 122, a front frame or front flange 124 which is distal from the base portion and defines a main aperture, and a peripheral housing 126 interconnecting the base portion and the front flange. The base portion and the front flange are substantially circular and co-axial, with the size of the main aperture exceeding the area of the base portion of the main housing so that the entire base portion is surrounded by the front flange. Generally speaking, the overall shape and dimension of the main housing is similar to that of the MR-16 housing.

The plurality of elongate protrusions is distributed in a spaced apart manner to permit a flow of air between adjacent protrusions so that convection cooling can be promoted.

Figure 3:
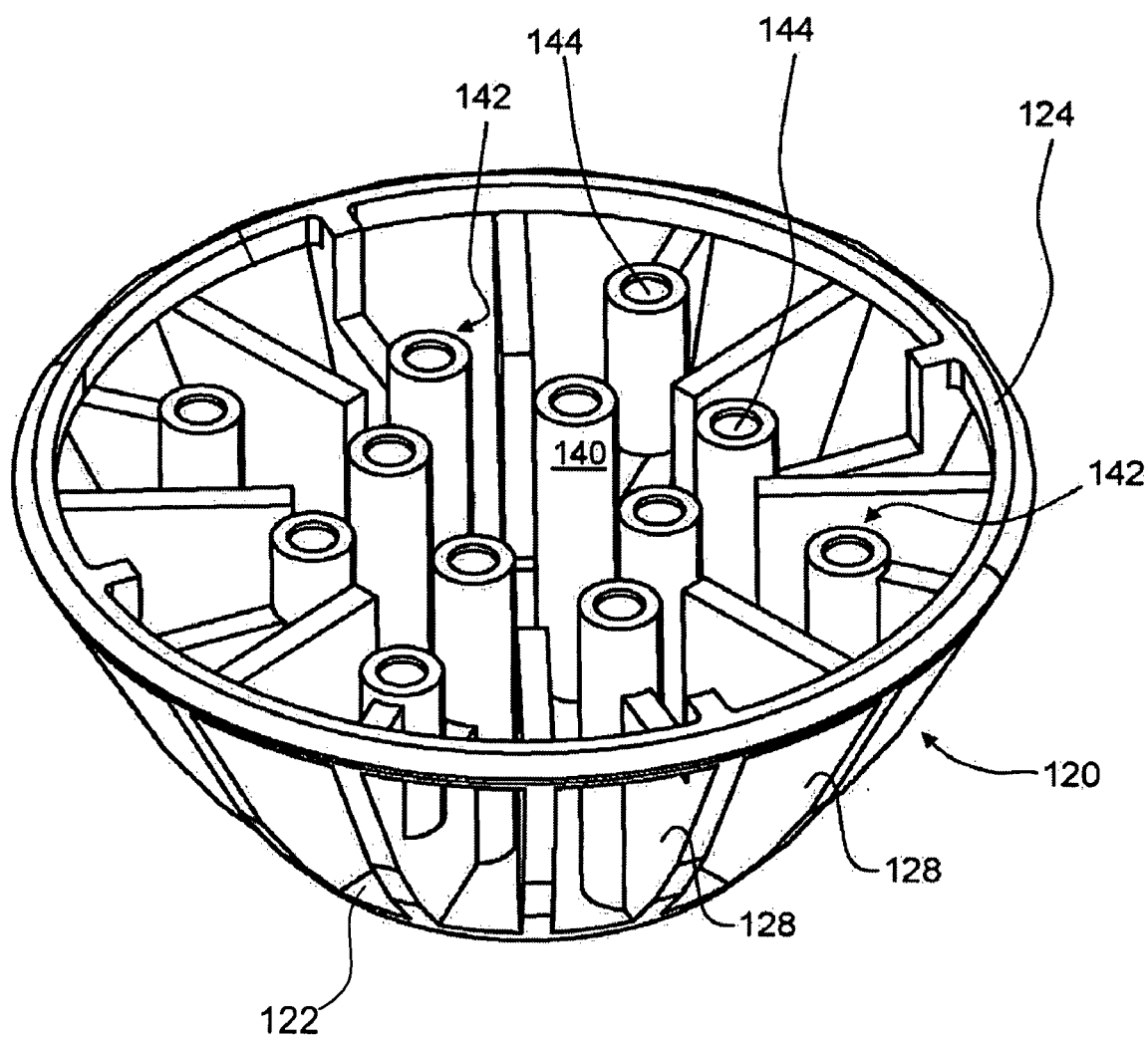
FIG. 3 is a perspective view showing the housing of the lighting device of FIG. 1 when viewed from the forward end.
Figure 4:
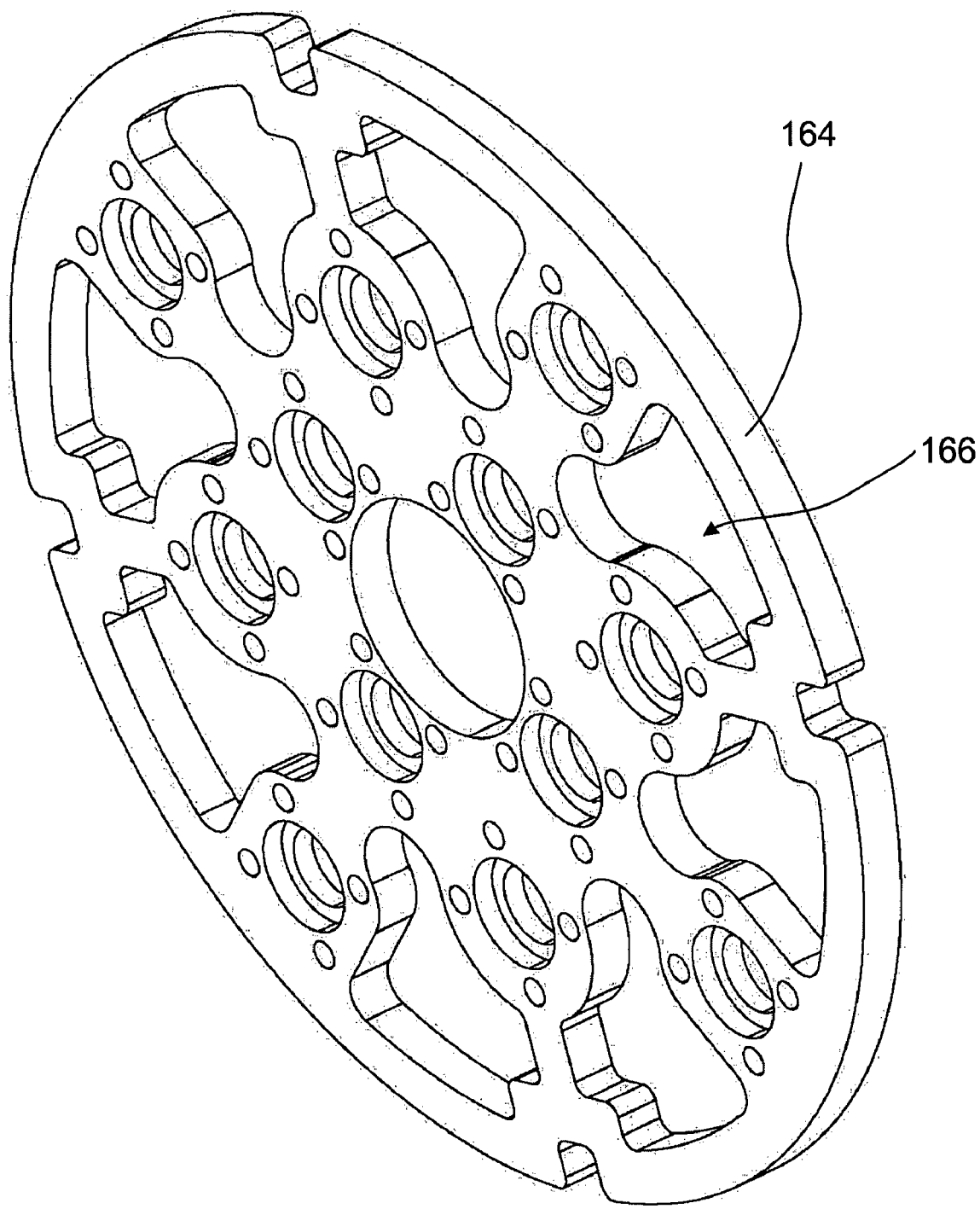
FIG. 4 is a perspective view of the printed circuit board of the lighting device of FIG. 1.
Figure 5:
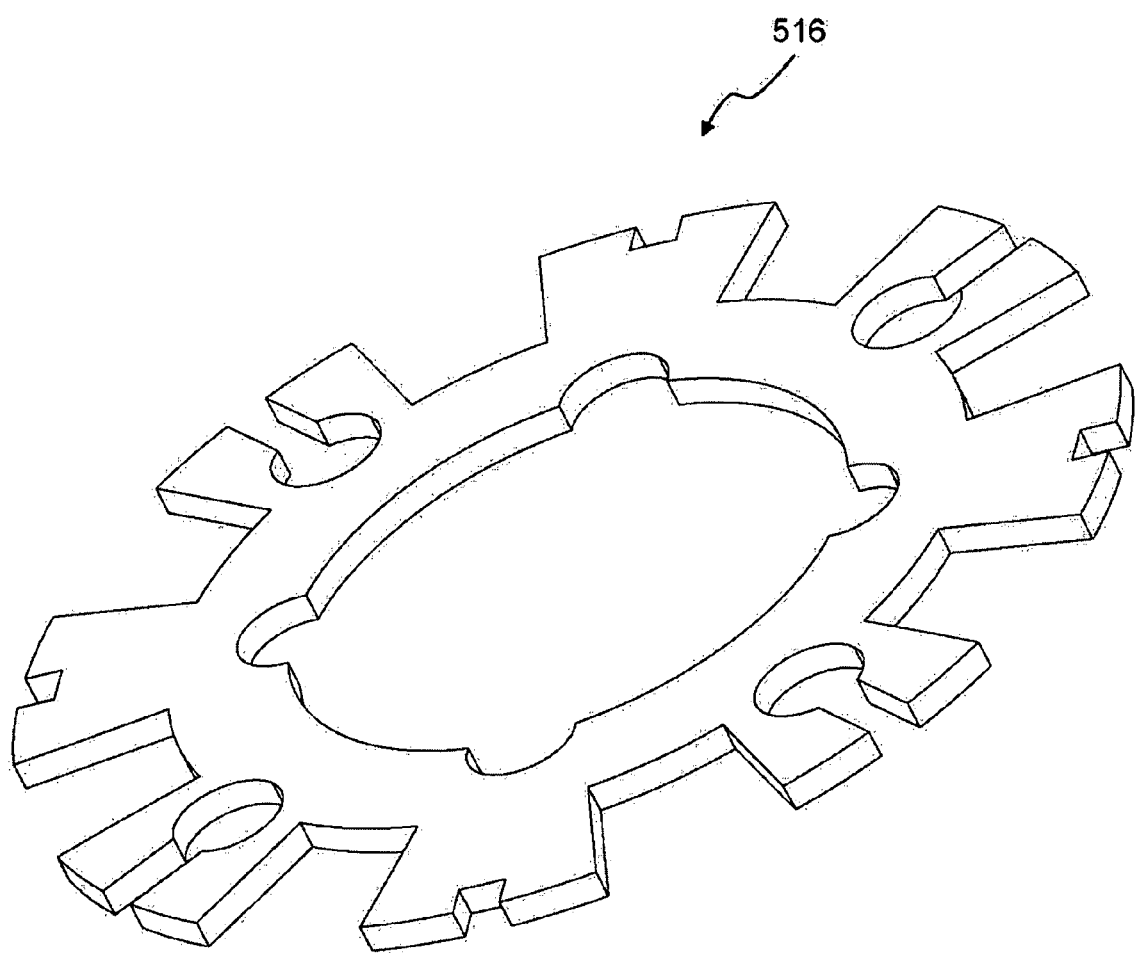
FIG. 5 is a perspective view showing a first thermal dissipated member of the lighting device of FIG. 1.
Figure 6:
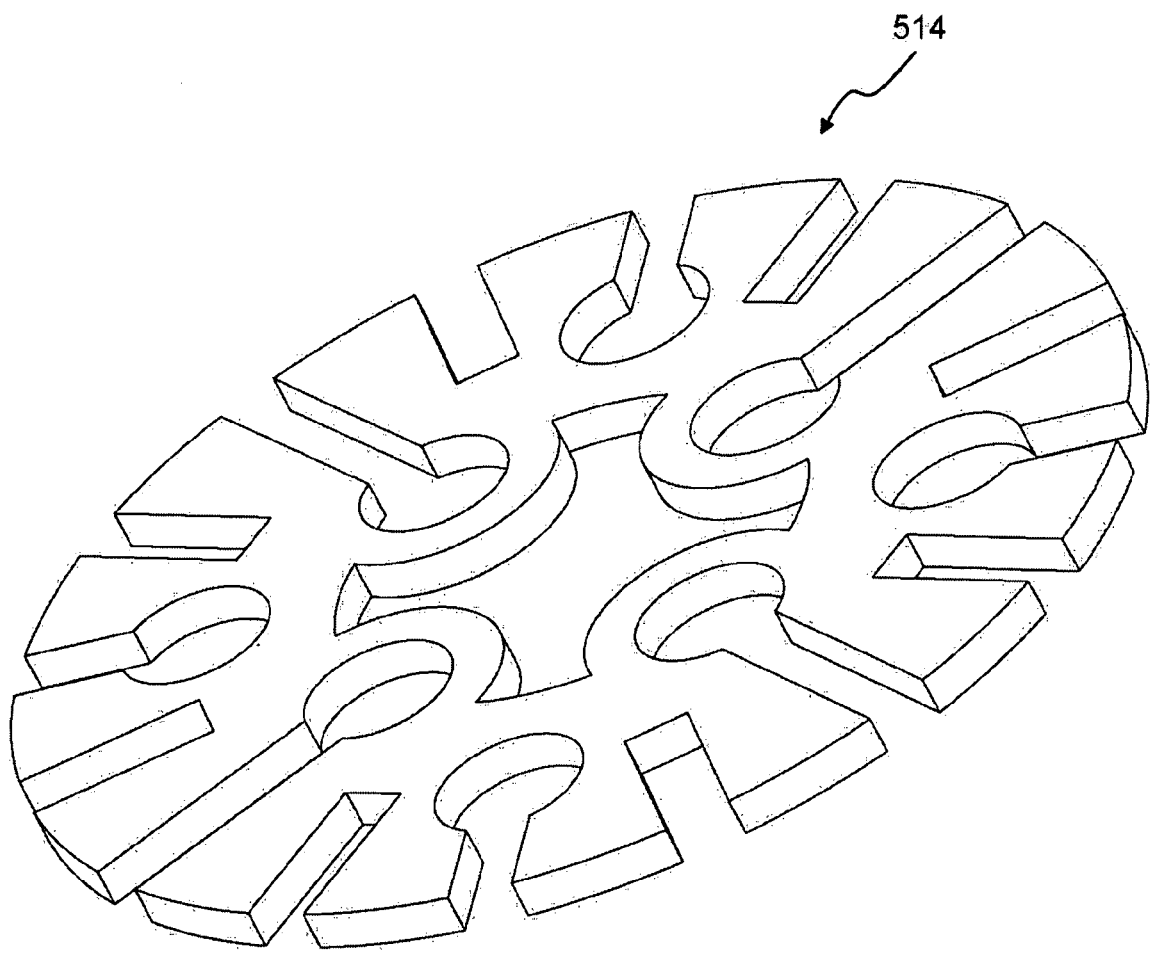
FIG. 6 is a perspective view showing a second thermal dissipated member of the lighting device of FIG. 1.
Figure 7:
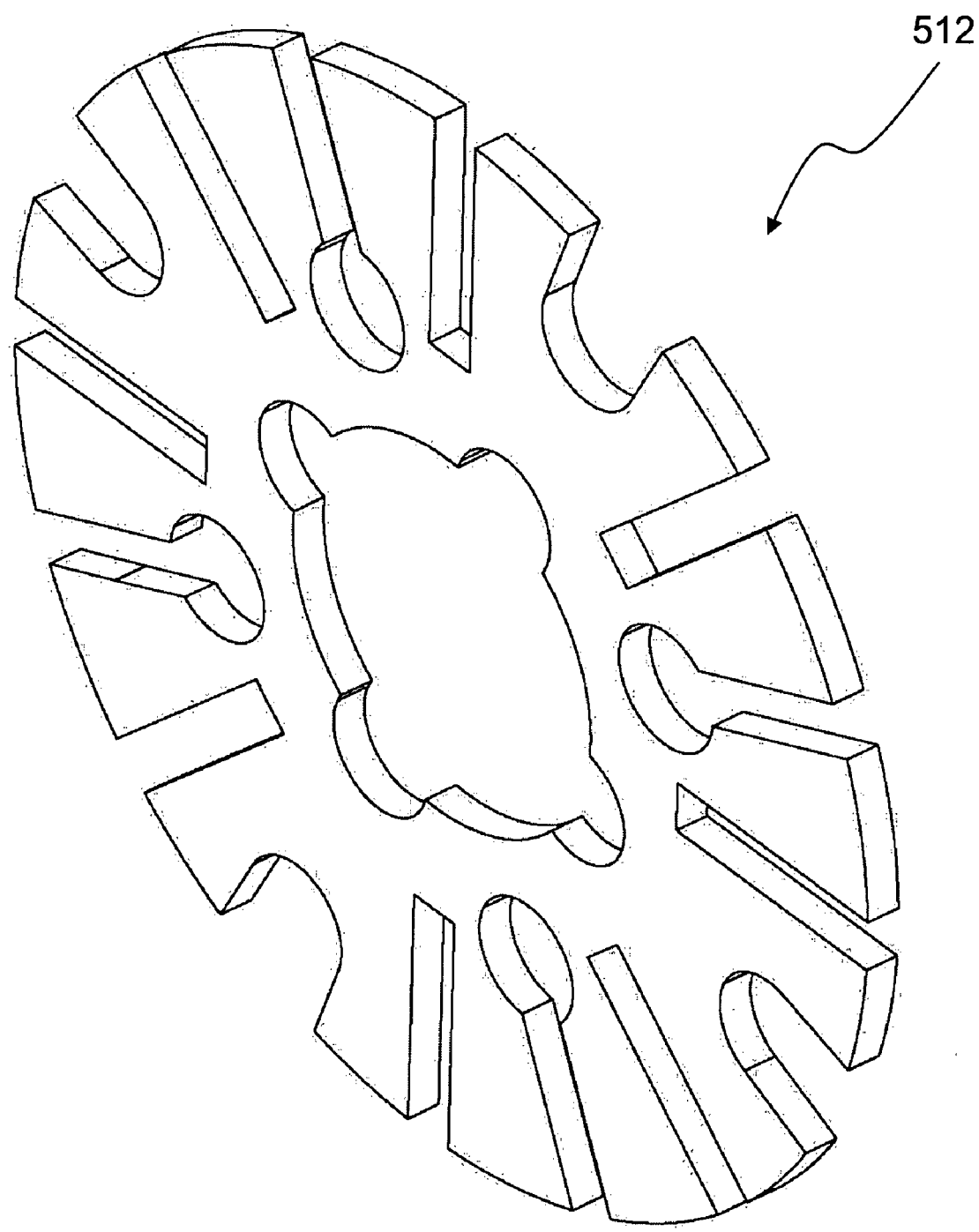
FIG. 7 is a perspective view showing a third thermal dissipated member of the lighting device of FIG. 1.

Each of the elongate protrusions extends forwardly from the base portion of the main housing along an axial direction, which is parallel to the longitudinal axis of the protrusions, and terminates at a forward end of the lamp. As shown in FIG. 3, the forward end 142 of the protrusions is axially distal from the base portion of the main housing, and is almost flush or is just short of the forward end of the main housing. The elongate protrusions, or at least a substantial length portion of the elongate protrusions, are surrounded by the peripheral housing. Such that the LEDs are located proximal the forward end of the main housing for forward light emission. As is more particularly shown in FIG. 3, a recess or seat 144 for receiving a light emitting chip is formed at the forward or distal end of a protrusion.

The base portion 122 and the front flange 124 of the peripheral housing are joined by a plurality of radially extending fins 128, which form part of the peripheral housing. Apertures are defined between adjacent pairs of the radial fins to provide for air-pathways so that cooling air can move transversely across the peripheral housing and through the apertures. An additional plurality of elongate protrusions is formed on a forward end of the radial fins and extends forwardly along the axial direction, as shown in FIG. 3. It will be appreciated that the available heat dissipation area for a given volume defined by the main housing is increased by the spaced apart and radial fins 128. The main housing, including the base portion 122, the radial fins 128, the front flange 124 and the protrusions 140, is singly or integrally moulded or cast from a thermally conductive material, such as aluminium or an aluminium alloy, for efficient thermal dissipation and good thermal continuity. Of course, the various parts could be welded, soldered, or otherwise joined or bonded together by appropriate means without loss of generality.

A plurality of LEDs is mounted on the forward end of the elongate protrusions for forward emission of light along a primary optical axis, which is generally parallel to the axial direction of the elongate protrusions to be explained in more detail below. By mounting the light emitting sources at the forward end of the elongate protrusions, which is distal from the base portion of the main housing, adverse optical crosstalk or interferences between beams of the individual light emitting sources, including interference due to reflection by the peripheral housing, would be mitigated. To maximise or optimise the heat-sinking function of the main housing, an LED chip 162 is bonded on the forward (or free) end protrusion by a thermally conductive bonding agent, such as silver epoxy glue. Furthermore, each of the LEDs is covered by a lens 160, for example, for LED protection, for diffusion, and/or for focusing, as is known by persons skilled in the art.

To connect electronic circuitry for driving and/or controlling operation of the light emitting sources, a circuit substrate 164, for example, a printed circuit board formed on a FR4 substrate, is disposed transversely at the forward end of the main housing so that the LEDs could be electrically bonded, for example, by wire bonding, to the circuitry. The printed circuit board is shaped to follow the internal curvature of the front flange 124 so that it sits squarely on the forward end of the main housing. A plurality of through-apertures is formed on the printed circuit board so that the protrusions can extend through the printed circuit board, thereby exposing the LEDs which are mounted on the forward end of the protrusions. In addition, a plurality of venting apertures 166 is formed on the printed circuit board for providing additional venting paths for cooling ventilation to pass between the space defined between the printed circuit board and the main housing to mitigate the adverse insulation due to the printed circuit board, since the more economical printed circuit boards are typically formed on a thermal insulator, for example, PTFE.

Since the LEDs are covered by lenses, which are usually formed of a thermal insulator (such as glass or clear plastics), and a typical printed circuit board is also formed of a thermal insulator substrate, the thermally conductive protrusions, which are an integral part of the thermally conductive main housing, together with the main housing, collectively form a heat sink with enhanced heat dissipation characteristics for providing a feasible operation environment for the light emitting sources, especially for light emitting sources the performance of which is relatively temperature dependent, or even temperature critical.

Figure 2:
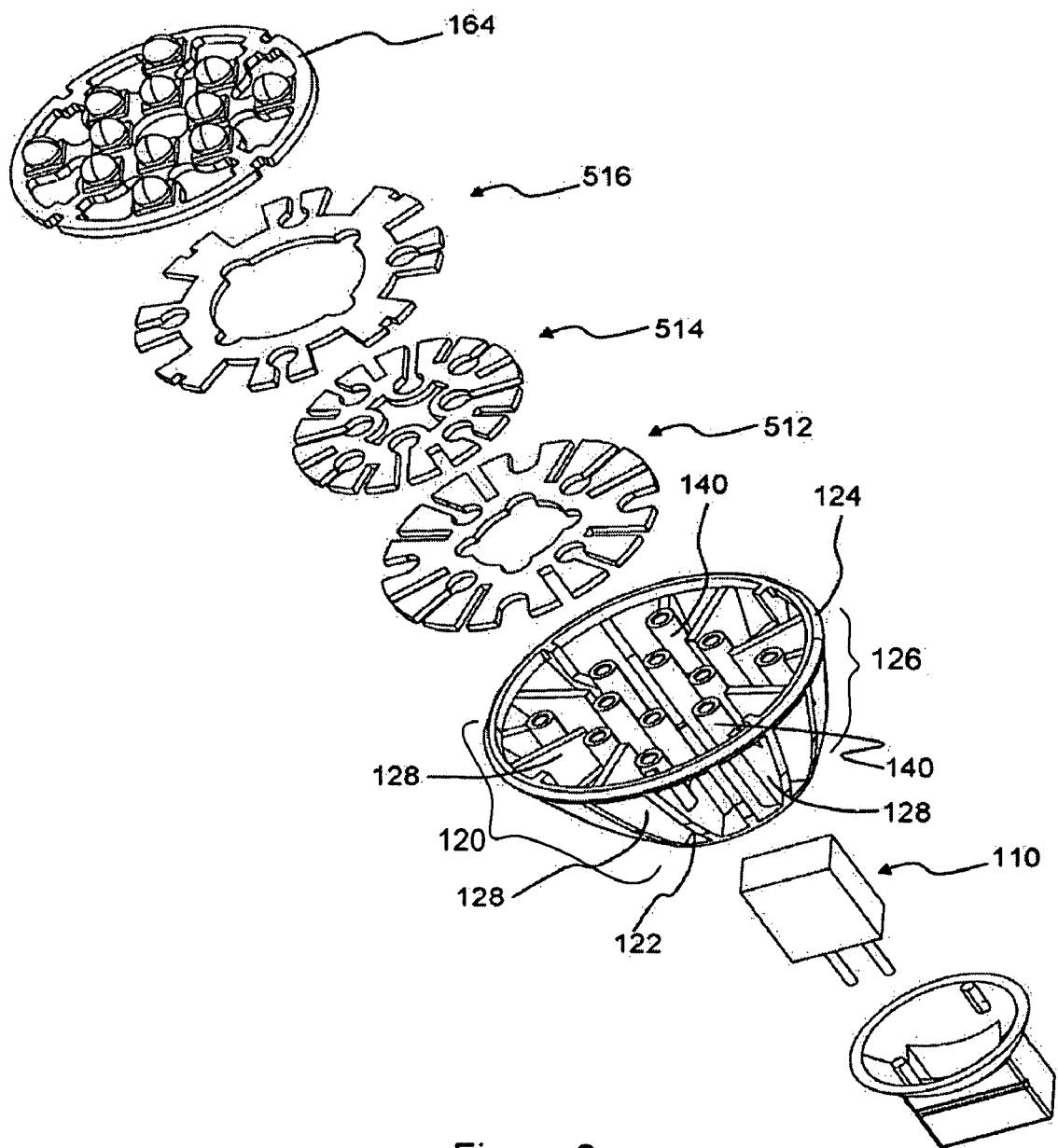
FIG. 2 is an exploded view illustrating various parts of the lighting device of FIG. 1.

To further increase the heat dissipation ability of the lighting device, an additional heat dissipation member, or a plurality of heat dissipation members 512, 514, 516 as more particularly shown in FIG. 2, may be added on to the main housing as an option to provide additional heat dissipation areas. For example, a plurality of spaced apart heat dissipation members, with venting apertures formed thereon, and with apertures permitting passage of the protrusions therethrough, could be assembled within the space defined by the main housing and intermediate the printed circuit board and the base portion of the main housing. Each of the heat dissipation members is thermally conductive and is thermally bonded to the protrusions as well as to the peripheral housing, for example, by a thermally conductive bonding agent such as silver epoxy. With such additional heat dissipation member, an additional heat dissipation path is provided so that heat can be dissipated via a path comprising a portion of the protrusion, which is intermediate the chip and the additional heat dissipation member, the heat dissipation member and the main housing. The additional heat dissipation members are bonded to the inside edge of the radial extending fins of the main housing, and are arranged in spaced apart relationship to permit cooling by ventilating between an adjacent pair of cooling members. In the instant example, the heat dissipation members and the printed circuit board are spaced-apart by at least 3 mm to facilitate convection cooling. The plurality of venting apertures, which is distributedly formed on the heat dissipation members, provides pathways for cooling air to flow between the confined space defined by the main housing and the outside environment. By disposing the plurality of spaced-apart heat dissipation members in addition to the main housing, which already serves as a heat dissipating heat sink, a lighting device with a substantially enhanced heat dissipation capacity is provided.

Figure 8:
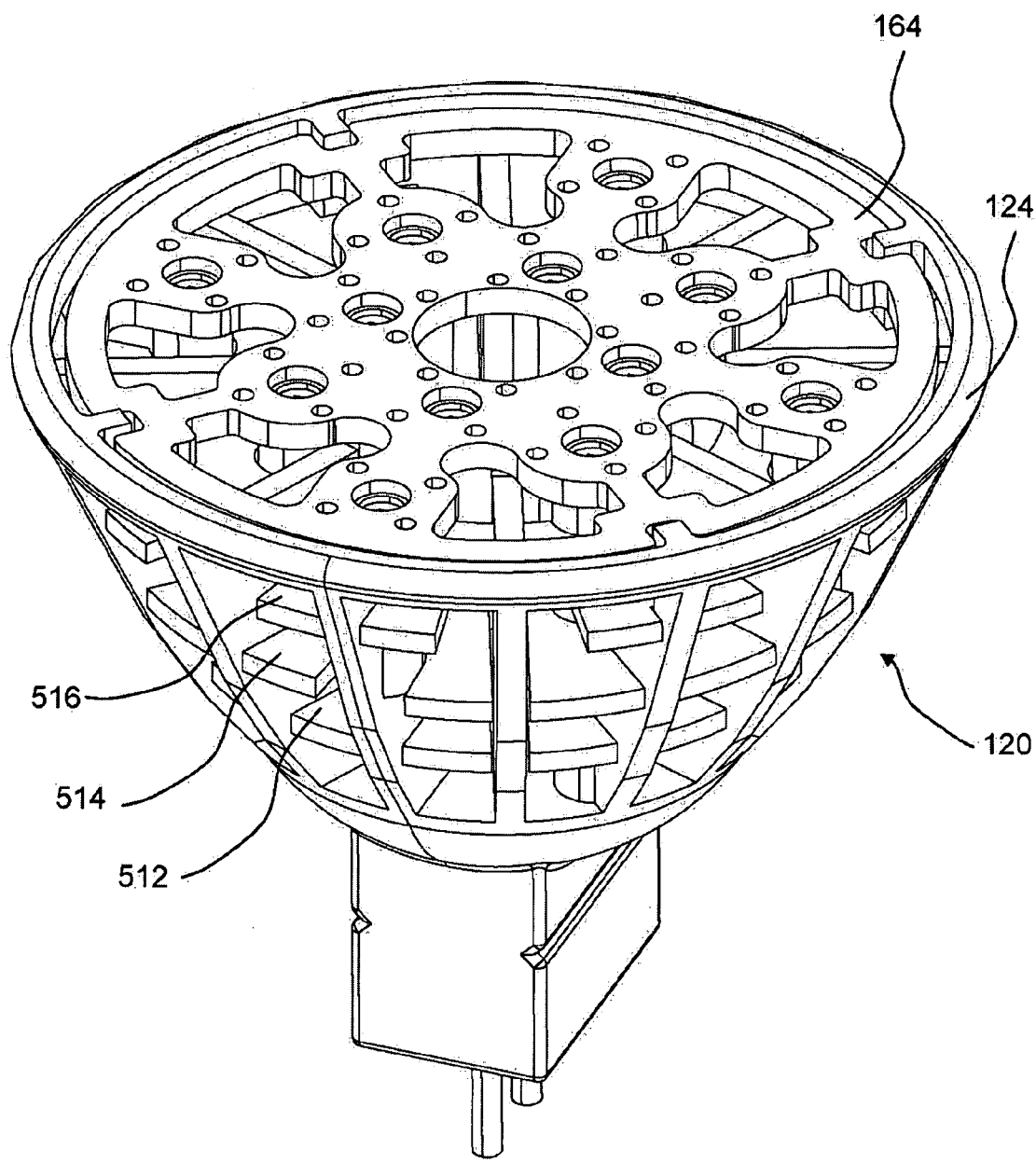
FIG. 8 is a perspective view of the lighting device of FIG. 1 with the lens covering the LEDs removed.

Generally, it would be desirable to maintain the temperature of a light emitting source, for example, the temperature of an LED chip mounted on the forward end of a protrusion, to not exceed a certain prescribed temperature above the ambient temperature. For example, it may be desirable to maintain the difference in temperature at the LED chip end ($T_{(hot)}$) and the base of the protrusion ($T_{(cold)}$) to below 5° C., in order to maintain an optimal operation efficiency. Take the MR-16 compatible lighting device of FIG. 1 as a convenient example, the light device comprises three heat dissipation members in addition to the main housing with an enhanced heat dissipation design. The total heat dissipation area provided by the main housing is 141.4 cm$^2$, comprising an effective area of 95.9 cm$^2$ contributed by the lamp fixture, an area of 12.0 cm$^2$ contributed by the first heat dissipation member 512, an area of 13.8 cm$^2$ contributed by the second heat dissipation member 514, and a further area of 19.7 cm$^2$ contributed by the third heat dissipation member 516. Such a heat dissipation area is significantly larger than that of a conventional MR-16 lamp. As is depicted in FIGS. 1, 2 and 8, a plurality of radial fins is formed at lateral extremities of a heat dissipation member. It will be noted that the plane of the radial fins of the heat dissipation member is orthogonal to the axes of the protrusions, while the plane of the radial fins of the peripheral is parallel to the axes of the protrusions.

The heat dissipation arrangement of this invention provides additional flexibility in that the actual heat dissipation area could be adjusted or varied in accordance with the actual heat dissipation requirements. For example, the heat dissipation capacity of the present lighting device could be adjusted by varying the number of additional heat dissipation members which are disposed intermediate the printed circuit board and the base portion of the main housing. Due to the curved or partially parabolic longitudinal profile of the main housing, the individual heat dissipation members can be pressed fitted onto the peripheral housing for subsequent bonding to the main housing, and this facilitates an ease of assembly and would therefore also improve productivity in assembling.

By providing an intermediate heat dissipation structure between the LEDs and the housing, improved heat dissipation properties could be obtained. The intermediate heat dissipation structure in the embodiment of FIG. 1 comprises a plurality of protrusions and the heat dissipation members. As an option, the intermediate heat dissipation structure may be without a heat dissipation member.

Figure 9:
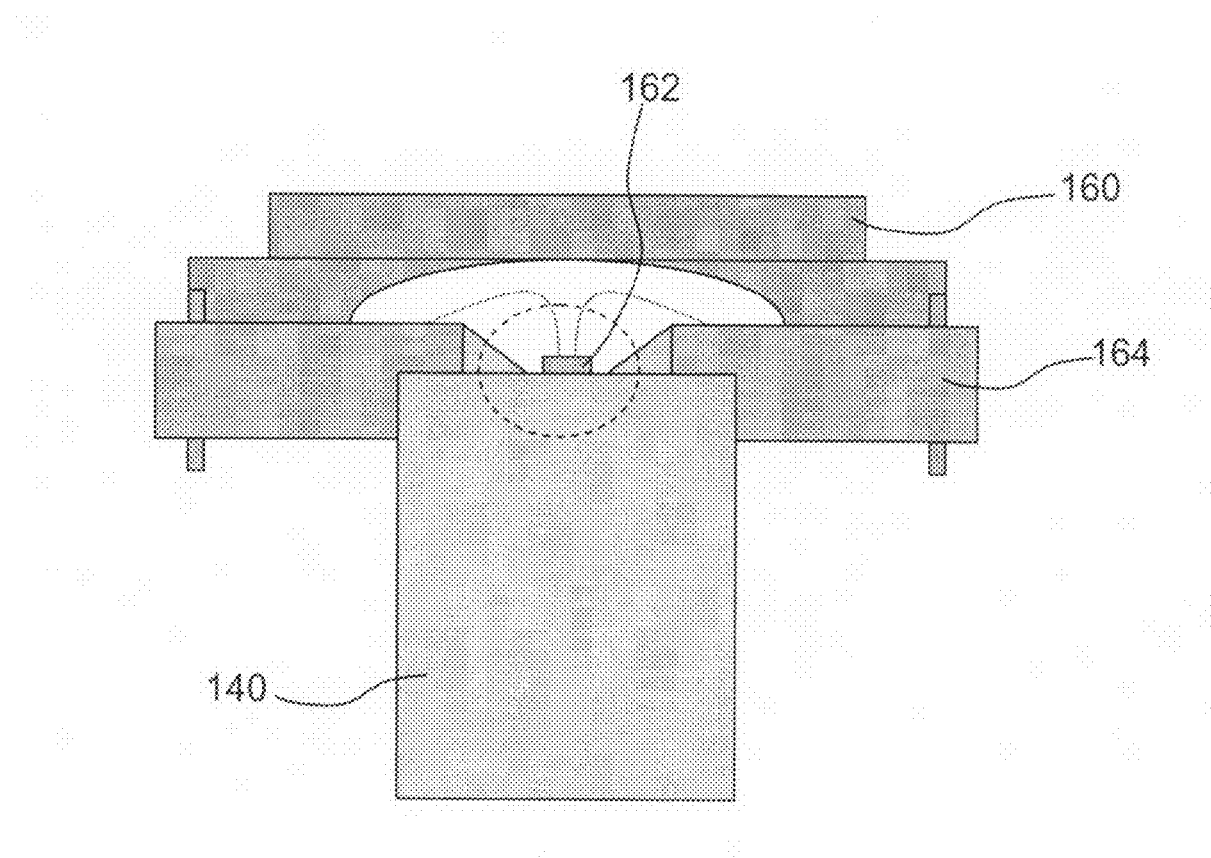
FIG. 9 is a longitudinal cross-sectional view showing the forward end portion of an exemplary protrusion of the lighting device of FIG. 1.
Figure 10:
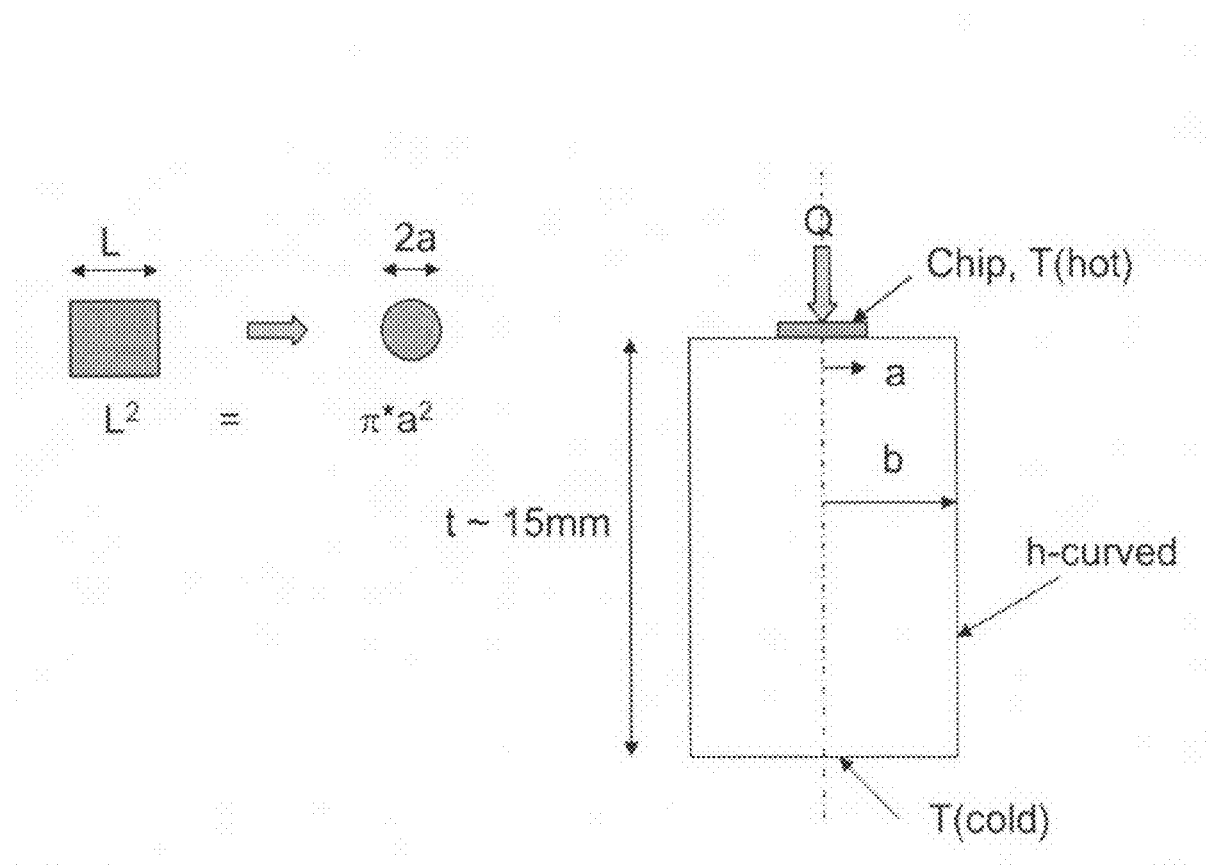
FIG. 10 is a schematic diagram showing an exemplary protrusion portion mounted with a light-emitting chip.

Turning next to general thermal dissipation relationships between an LED chip mounted on an elongate protrusion and the ambient condition with reference to FIG. 9. An LED chip is shown bonded in thermal communication with the elongate protrusion of the fixture of FIG. 1 so that heat generated by the LED chip could be transmitted to the main housing for dissipation to the ambient via the intermediate elongate protrusion.

In another preferred embodiment, the lighting device is identical to that of FIG. 1, except that thermally conductive protrusions do not extend from the main housing. Instead, the thermally conductive protrusions are integrally mounted on the heat dissipation member and extend between the printed circuit board and the heat dissipation member. With this arrangement, heat generated by the LED chips is transferred to the housing via an intermediate heat dissipation structure which comprises the protrusions and the heat dissipation plate or plates.

While the present invention has been explained by reference to the examples or preferred embodiments described above, it will be appreciated that those are examples to assist understanding of the present invention and are not meant to be restrictive. Variations or modifications which are obvious or trivial to persons skilled in the art, as well as improvements made thereon, should be considered as equivalents of this invention.

For example, the elongate protrusions may have different heights so that LEDs may be mounted at different axial distances from the base portion to suit specific applications.

Furthermore, while the present invention has been explained by reference to discrete LED chip components, it should be appreciated that the invention can apply, whether with or without modification, to other light emitting sources without loss of generality. Also, although this invention has been illustrated with reference to a MR-16 compatible lamp, it should be appreciated that the invention is not limited to the MR-16 type fixture without loss of generality.

The invention claimed is:

1. A lighting device comprising a plurality of light emitting sources mounted on a thermally conductive housing and electrically connected to a circuit board, wherein said housing comprises a base portion which is spaced apart from said circuit board, and an intermediate heat dissipation structure in thermal communication with said plurality of light emitting sources, the intermediate heat dissipation structure being disposed intermediate said circuit board and said base portion of said housing, for promoting cooling by convection, said intermediate heat dissipation structure comprising a plurality of protrusions thermally connecting said plurality of light emitting sources with said housing, said plurality of protrusions being spaced apart, with respect to each other, and wherein the spacing between adjacent protrusions is arranged so as to allow heat dissipation from said protrusions upon movement of air across said housing;

each said light emitting source being mounted on a forward end or a free end of said protrusion so that heat generated by a light emitting source is transferable to said base portion via said protrusion for heat dissipation, and, to allow forward emission of light away from said base portion along a primary optical axis, wherein each said protrusion extends forwardly from the main housing towards the circuit board along the primary optical axis of the light emitting source mounted thereon.

2. A lighting device according to claim 1, wherein said circuit board is mounted on said housing at a location proximal to the forward end of said plurality of protrusions.

3. A lighting device according to claim 2, wherein said circuit board comprises a printed circuit board which is formed on a thermally insulated substrate.

4. A lighting device according to claim 3, wherein said thermally conductive housing comprises a base portion and a peripheral portion, said peripheral portion extending from said base portion and surrounding said plurality of protrusions.

5. A lighting device according to claim 4, wherein said printed circuit board is mounted to a forward end of said peripheral portion of said housing, and wherein said printed circuit board is orthogonal to said protrusions.

6. A lighting device according to claim 5, wherein driver circuitry for operation and/or control of said plurality of light emitting sources is formed on said printed circuit board.

7. A lighting device according to claim 6, wherein a plurality of venting apertures is formed on said printed circuit board.

8. A lighting device according to claim 7, wherein said protrusions and said peripheral portion of said housing collectively form a support structure for receiving said printed circuit board on said housing in a close fitted manner.

9. A lighting device according to claim 8, wherein said peripheral portion of said housing is grid-like such that a plurality of heat dissipation paths for heat dissipation by convection involving said protrusions is defined between lateral extremities of said peripheral portion of said housing.

10. A lighting device according to claim 9, wherein each light emitting source is covered by a lens.

11. A lighting device according to claim 10, wherein a light emitting source comprising a light emitting chip, including a light emitting diode chip or a laser diode chip, is individually mounted on a forward or free end of said protrusion with said chip in thermal communication with said protrusion.

12. A lighting device according to claim 11, wherein each said protrusion is elongate, finger-shaped or column-shaped, and has a longitudinal axis parallel to the forward optical axis of the light emitting source mounted thereon.

13. A lighting device according to claim 12, wherein each said protrusion is between 3 mm to 20 mm in height.

14. A lighting device according to claim 13, wherein each protrusion has an effective diameter of between 4 and 7 mm.

15. A lighting device according to claim 14, wherein said printed circuit board is substantially orthogonal to the longitudinal axis of said protrusions.

16. A lighting device according to claim 15, wherein said printed circuit board is supported on said protrusions with free ends of said plurality of protrusions extending through said printed circuit board.

17. A lighting device according to claim 15, wherein the axial spacing between said printed circuit board and said base portion of said housing is at least 3 mm.

18. A lighting device according to claim 13, wherein at least one thermally conductive member for dissipating heat from said plurality of protrusions is disposed intermediate said printed circuit board and the base of said protrusions, said thermally conductive member being thermally coupled to said protrusions and said housing so that a portion of heat generated by said plurality of light emitting sources is transferred to said housing via said protrusions and said thermally conductive member.

19. A lighting device according to claim 18, wherein said thermally conductive member comprises a metallic board which is parallel to and spaced apart from said printed circuit board; said metallic board being thermally bonded to said protrusions and said housing, and being arranged for dissipating heat generated by said light emitting sources.

20. A lighting device according to claim 19, wherein said metallic board and said printed circuit board are spaced apart to permit convection cooling there-between.

21. A lighting device according to claim 20, wherein a plurality of venting apertures is formed on said thermally conductive heat dissipation member.

22. A lighting device according to claim 20, wherein said metallic board and said printed circuit board are spaced apart by at least 3 mm.

23. A lighting device according to claim 21, wherein said metallic board and said base portion of said housing are arranged to permit cooling by convection there-between.

24. A lighting device according to claim 1, wherein said protrusions are integrally formed on the base portion of said housing.

25. A lighting device according to claim 24, wherein said protrusions and said housing are integrally formed from aluminum or an aluminum alloy.

26. A lighting device according to claim 24, wherein said protrusions are shaped and dimensioned so that a temperature difference between the free end and base of said protrusion does not exceed 5 degrees Celsius during operation of said light emitting sources.

27. A lighting device according to claim 26, wherein said housing is compatible with MR16 standard.

28. A lighting device according to claim 1, wherein said intermediate heat dissipation structure comprises at least one thermally conductive heat dissipation member, said thermally conductive heat dissipation member being intermediate said circuit board and said based portion of said housing and being thermally coupled to both said plurality of light emitting diodes and said housing, and being spaced apart from both said circuit board and said based portion for allowing cooling by convection there-between; and wherein a plurality of thermally conductive protrusions extends from said thermally conductive heat dissipation member towards said circuit board; and wherein each said light emitting source is mounted on said protrusion such that heat generated by said plurality of light emitting sources is transferable to said housing through said protrusions and said thermally conductive heat dissipation member.

29. A lighting device comprising:—
a thermally conductive housing comprising a base portion, a plurality of spaced-apart protrusions extending from the base portion, and a peripheral housing surrounding said protrusions; and
a plurality of light emitting sources electrically connected to a circuit board,
wherein each said light emitting source is mounted on a said protrusion and in thermal communication therewith so that heat generated by said plurality of light emitting sources is transferable from said light emitting sources via said protrusions to said thermally conductive housing for heat dissipation;
wherein said printed circuit board and said housing are arranged for convection cooling of said protrusions by air flow between said printed circuit board and said housing;
wherein said peripheral portion of said housing is grid or cage-like, and is configured so that air entering from one lateral side of said grid or cage-like peripheral housing encounters said protrusions prior to exit from another opposite lateral side of said housing.

30. A lighting device according to claim 29, wherein sat least one thermally conductive member for dissipating heat from said plurality of protrusions is disposed intermediate said printed circuit board and the base of said protrusions, said thermally conductive member being thermally coupled to said protrusions and said housing, so that a portion of heat generated by said plurality of light emitting sources is transferred to said housing via said protrusions and said thermally conductive member.

31. A lighting device according to claim 29, wherein said peripheral housing is connected to a said protrusion by a radial extending heat dissipating fin.

32. A lighting device comprising:—
a thermally conductive housing and a plurality of light emitting sources electrically connected to a circuit board, wherein said housing comprises a base portion which is spaced apart from said circuit board and an intermediate heat dissipation structure which is disposed intermediate said circuit board and said base portion of said housing, said intermediate heat dissipation structure being arranged for promoting cooling by convection;
each said light emitting source is mounted on a said protrusion and in thermal communication therewith so that heat generated by said plurality of light emitting sources is transferable from said light emitting sources via said protrusions to said thermally conductive housing for heat dissipation; and
said circuit board being spaced apart from said base portion of said housing such that a space for dissipation of heat by convection is formed between said circuit board and said base portion of said housing;
wherein at least one thermally conductive heat dissipation member for heat dissipation is disposed intermediate said printed circuit board and the base of said protrusions, said thermally conductive member being thermally coupled to said protrusions, and said housing, so that a portion of heat generated by said plurality of light emitting sources is transferred to said housing via said protrusions and said thermally conductive heat dissipation member.

* * * * *